United States Patent
Kawadahara

(10) Patent No.: US 11,148,938 B2
(45) Date of Patent: Oct. 19, 2021

(54) SUBSTRATE BONDING APPARATUS, SUBSTRATE PAIRING APPARATUS, AND SEMICONDUCTOR DEVICE MANUFACTURING METHOD

(71) Applicant: Toshiba Memory Corporation, Minato-ku (JP)

(72) Inventor: Sho Kawadahara, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/542,431

(22) Filed: Aug. 16, 2019

(65) Prior Publication Data

US 2020/0286853 A1    Sep. 10, 2020

(30) Foreign Application Priority Data

Mar. 5, 2019  (JP) .............................. JP2019-039914

(51) Int. Cl.
*B81C 1/00*  (2006.01)
*H01L 23/00*  (2006.01)
(Continued)

(52) U.S. Cl.
CPC ........ *B81C 1/00357* (2013.01); *H01L 21/681* (2013.01); *H01L 22/12* (2013.01);
(Continued)

(58) Field of Classification Search
CPC ............... B81C 1/00357; H01L 23/544; H01L 21/67092; H01L 21/681; H01L 2224/75753
See application file for complete search history.

(56) References Cited

U.S. PATENT DOCUMENTS

2009/0130821 A1*  5/2009  Cox ..................... H01L 24/94
438/455

FOREIGN PATENT DOCUMENTS

| JP | 5369588 B2 | 12/2013 |
| JP | 2017-068002 A | 4/2017 |
| JP | 2018-056481 A | 4/2018 |

OTHER PUBLICATIONS

Taouil et al. "On Maximizing the Compound Yield for 3D Wafer-to-Wafer Stacked ICs", IEEE, International Test Conference, 2010 (Year: 2010).*

(Continued)

*Primary Examiner* — Selim U Ahmed
*Assistant Examiner* — Evan G Clinton
(74) *Attorney, Agent, or Firm* — Oblon, McClelland, Maier & Neustadt, L.L.P.

(57) ABSTRACT

According to one embodiment, a controller is configured to calculate a matching rate of grid shapes between each semiconductor wafer of a first semiconductor wafer group and each semiconductor wafer of a second semiconductor wafer group, and generate pairing information, into which combinations of semiconductor wafers used in calculation of matching rates are registered when the matching rates fall within a predetermined range. Further, the controller is configured to select a first semiconductor wafer to be held by a first semiconductor wafer holder from the first semiconductor wafer group, and select a second semiconductor wafer from semiconductor wafers of the second semiconductor wafer group, which are paired with the first semiconductor wafer, with reference to the pairing information.

16 Claims, 8 Drawing Sheets

(51) Int. Cl.
*H01L 21/66* (2006.01)
*H01L 21/68* (2006.01)

(52) U.S. Cl.
CPC .............. *H01L 22/22* (2013.01); *H01L 24/75* (2013.01); *H01L 24/83* (2013.01); *H01L 2224/75753* (2013.01)

(56) References Cited

OTHER PUBLICATIONS

Lee et al., "Wafer-to-Wafer Alignment for Three-Dimensional Integration: A review", Journal of Microelectromechanical Systems, vol. 20, No. 4, Aug. 2011, pp. 885-898 (Year: 2011).*

* cited by examiner

FIG.2
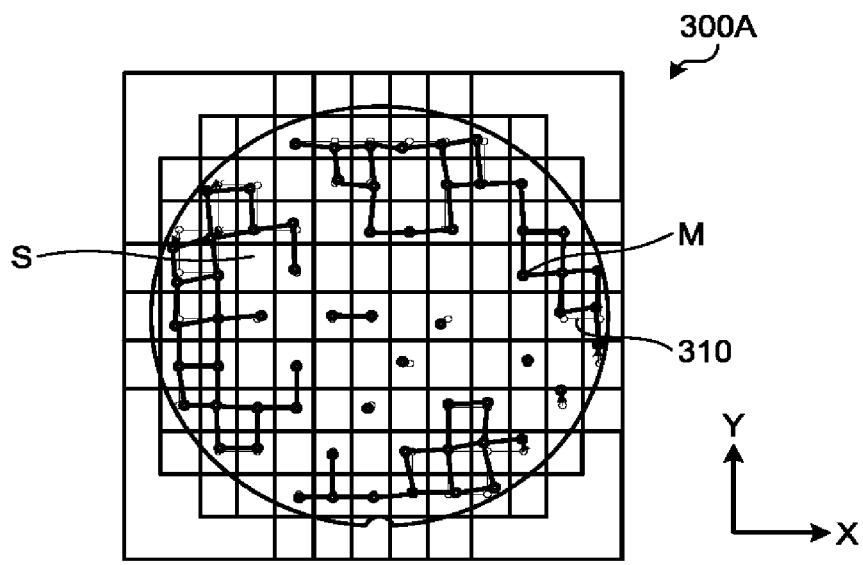
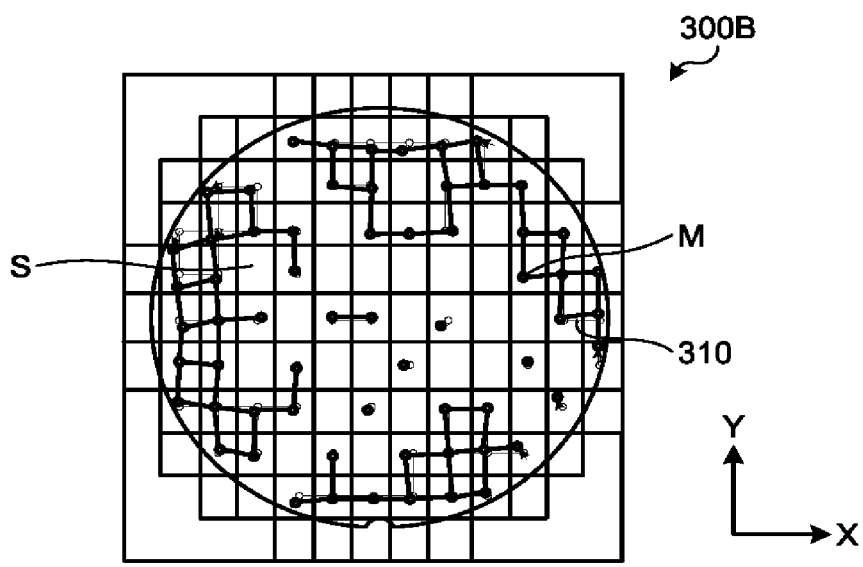

FIG.4

| GRID MATCHING RATE | | GRID DATA ABOUT SECOND SUBSTRATE | | |
|---|---|---|---|---|
| | | 300C | 300D | 300E |
| GRID DATA ABOUT FIRST SUBSTRATE | 300A | 90% | 80% | 70% |
| | 300B | 85% | 90% | 95% |

FIG.5A

| FIRST STORAGE CONTAINER | | SECOND STORAGE CONTAINER | |
|---|---|---|---|
| SLOT NUMBER | FIRST SUBSTRATE IDENTIFICATION INFORMATION | SLOT NUMBER | SECOND SUBSTRATE IDENTIFICATION INFORMATION |
| 1 | CELLW1 | 1 | PERIW1 |
| 2 | CELLW2 | 2 | PERIW2 |
| 3 | CELLW3 | 3 | PERIW3 |
| ⋮ | ⋮ | ⋮ | ⋮ |
| n | CELLWn | n | PERIWn |

FIG.5B

| FIRST SUBSTRATE IDENTIFICATION INFORMATION | SECOND SUBSTRATE IDENTIFICATION INFORMATION |
|---|---|
| CELLW1 | PERIW2 |
| | PERIW5 |
| | PERIW15 |
| | ⋮ |
| CELLW2 | PERIW1 |
| | PERIW6 |
| | PERIW20 |
| | ⋮ |
| ⋮ | ⋮ |
| CELLWn | PERIW1 |
| | PERIW2 |
| | PERIW8 |
| | ⋮ |

SUBSTRATE BONDING APPARATUS, SUBSTRATE PAIRING APPARATUS, AND SEMICONDUCTOR DEVICE MANUFACTURING METHOD

CROSS-REFERENCE TO RELATED APPLICATIONS

This application is based upon and claims the benefit of priority from Japanese Patent Application No. 2019-039914, filed on Mar. 5, 2019; the entire contents of which are incorporated herein by reference.

FIELD

An embodiment described herein relates generally to a substrate bonding apparatus, substrate pairing apparatus, and a semiconductor device manufacturing method.

BACKGROUND

In order to obtain a semiconductor device of a multilayer type, a bonding apparatus is known which laminates and bonds two semiconductor substrates as they are, without turning the semiconductor substrate into individual pieces by cutting and dividing.

BRIEF DESCRIPTION OF THE DRAWINGS

FIG. 2 is a diagram illustrating an example of grid measurement information on first substrates;

FIG. 4 is a diagram illustrating an example of calculation results of a grid matching rate;

FIGS. 5A and 5B are diagrams illustrating examples of substrate information;

DETAILED DESCRIPTION

In general, according to one embodiment, a substrate bonding apparatus includes a first semiconductor wafer holder configured to hold a semiconductor wafer selected from a first semiconductor wafer group, a second semiconductor wafer holder arranged opposite to the first semiconductor wafer holder, and configured to hold a semiconductor wafer selected from a second semiconductor wafer group, and a controller configured to control lamination bonding of semiconductor wafers held by the first semiconductor wafer holder and the second semiconductor wafer holder. The controller is configured to calculate a matching rate of grid shapes between each semiconductor wafer of the first semiconductor wafer group and each semiconductor wafer of the second semiconductor wafer group. Then, the controller is configured to generate pairing information, into which combinations of semiconductor wafers used in calculation of matching rates are registered when the matching rates fall within a predetermined range. Thereafter, the controller is configured to select a first semiconductor wafer to be held by the first semiconductor wafer holder from the first semiconductor wafer group. Then, the controller is configured to select a second semiconductor wafer from semiconductor wafers of the second semiconductor wafer group, which are paired with the first semiconductor wafer, with reference to the pairing information.

Incidentally, shot regions to be turned into chips are arranged on a semiconductor substrate. However, when lamination bonding is performed by the bonding apparatus, no consideration is given to misalignment between the shot regions of two semiconductor substrates to be laminated and bonded. Accordingly, there is a demand for a technique that can improve alignment accuracy between the shot regions of two semiconductor substrates.

An exemplary embodiment of a substrate bonding apparatus, a substrate pairing apparatus, and a semiconductor device manufacturing method will be explained below in detail with reference to the accompanying drawings. The present invention is not limited to the following embodiment. The sectional views of a substrate bonding apparatus and a semiconductor device used in the following embodiment are schematic, and so the relationship between the thickness and width of each layer and/or the thickness ratios between respective layers may be different from actual states.

Figure 1:
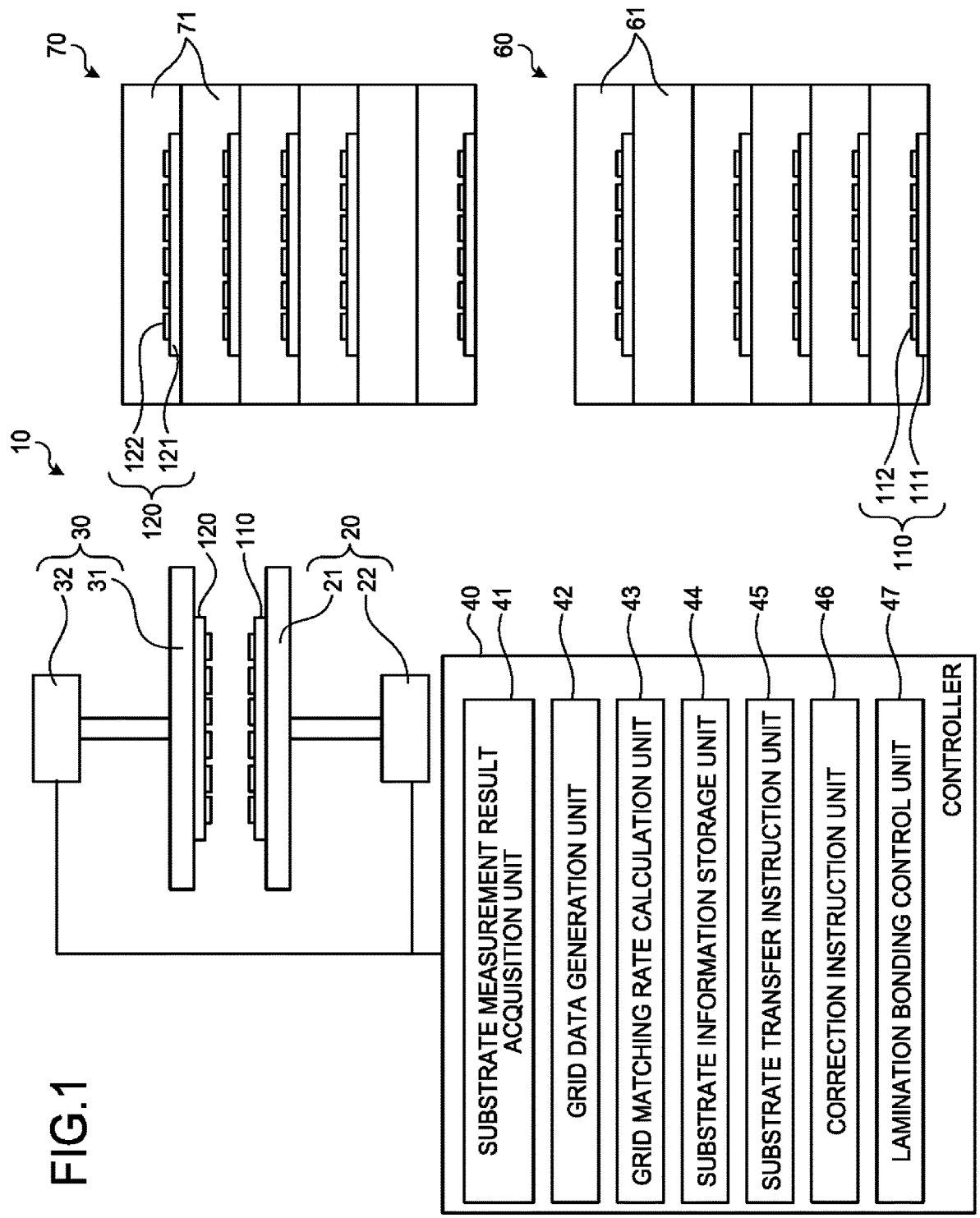
FIG. 1 is a diagram schematically illustrating an example of a bonding apparatus according to an embodiment.

FIG. 1 is a diagram schematically illustrating an example of a bonding apparatus according to an embodiment. The bonding apparatus 10 includes a first substrate holder 20, a second substrate holder 30, and a controller 40. Near the bonding apparatus 10, storage containers 60 and 70 including a plurality of slots 61 and 71 are placed. In the example illustrated here, the first storage container 60 stores first substrates 110 and the second storage container 70 stores second substrates 120. For example, each of the first substrates 110 is a semiconductor substrate 111 with a memory cell layer 112 arranged on one face. The memory cell layer 112 includes memory cells of a NAND type flash memory (which will be referred to as "NAND memory", hereinafter) or the like. Further, for example, each of the second substrates 120 is a semiconductor substrate 121 with a peripheral circuit layer 122 arranged on one face. The peripheral circuit layer 122 includes drive circuits, such as Complementary Metal-Oxide-Semiconductor (CMOS) transistors, for performing driving operations to the memory cells. It is assumed that each of the first storage container 60 and the second storage container 70 includes an n-number of slots 61 or 71 ("n" is a natural number of 2 or more). The first substrates 110 are stored in the slots 61, and the second substrates 120 are stored in the slots 71.

The first substrate holder 20 includes a first stage 21 configured to hold each first substrate 110 by a chucking mechanism, and a first drive mechanism 22 configured to move the first stage 21 in a direction parallel with the substrate holding plane and in a direction perpendicular thereto, and to rotate the first stage 21 in the substrate holding plane. For the chucking mechanism, for example, vacuum suction, electrostatic attraction, or the like may be used. In this example, the first stage 21 chucks that face of the first substrate 110 on which no memory cell layer 112 is arranged. The first drive mechanism 22 moves the first stage 21 in accordance with an instruction from the controller 40. Further, the first stage 21 has a configuration that can apply a force to the first substrate 110 in a direction parallel with the substrate holding plane.

The second substrate holder 30 includes a second stage 31 configured to hold each second substrate 120 by a chucking mechanism, and a second drive mechanism 32 configured to move the second stage 31 in a direction parallel with the substrate holding plane and in a direction perpendicular thereto, and to rotate the second stage 31 in the substrate holding plane. For the chucking mechanism, for example, vacuum suction, electrostatic attraction, or the like may be used. The second stage 31 is arranged such that the substrate holding face of the second stage 31 is opposed to the substrate holding face of the first stage 21. Here, in this example, the second stage 31 chucks that face of the second substrate 120 on which no peripheral circuit layer 122 is arranged. The second drive mechanism 32 moves the second stage 31 in accordance with an instruction from the controller 40. Further, the second stage 31 has a configuration that can apply a force to the second substrate 120 in a direction parallel with the substrate holding plane.

The controller 40 includes a substrate measurement result acquisition unit 41, a grid data generation unit 42, a grid matching rate calculation unit 43, a substrate information storage unit 44, a substrate transfer instruction unit 45, a correction instruction unit 46, and a lamination bonding control unit 47.

The substrate measurement result acquisition unit 41 is configured to acquire substrate measurement results about measurement performed to all the first substrates 110 stored in the first storage container 60 and all the second substrates 120 stored in the second storage container 70. Each of the substrate measurement results is acquired by measuring the positions of predetermined patterns on each of the first substrates 110 and the second substrates 120. For example, the patterns to be measured are formed of alignment marks or overlay measurement marks in shot regions, or predetermined device elements. The position measurement is performed by using an overlay inspection apparatus, absolute position measuring apparatus, substrate shape measuring apparatus, or the like.

The grid data generation unit 42 is configured to generate grid data, in which the positions of predetermined patterns are connected to the positions of predetermined patterns by lines, for each of the substrate measurement results. The generation of grid data is performed to all the first substrates 110 in the first storage container 60 and all the second substrates 120 in the second storage container 70.

Figure 3:
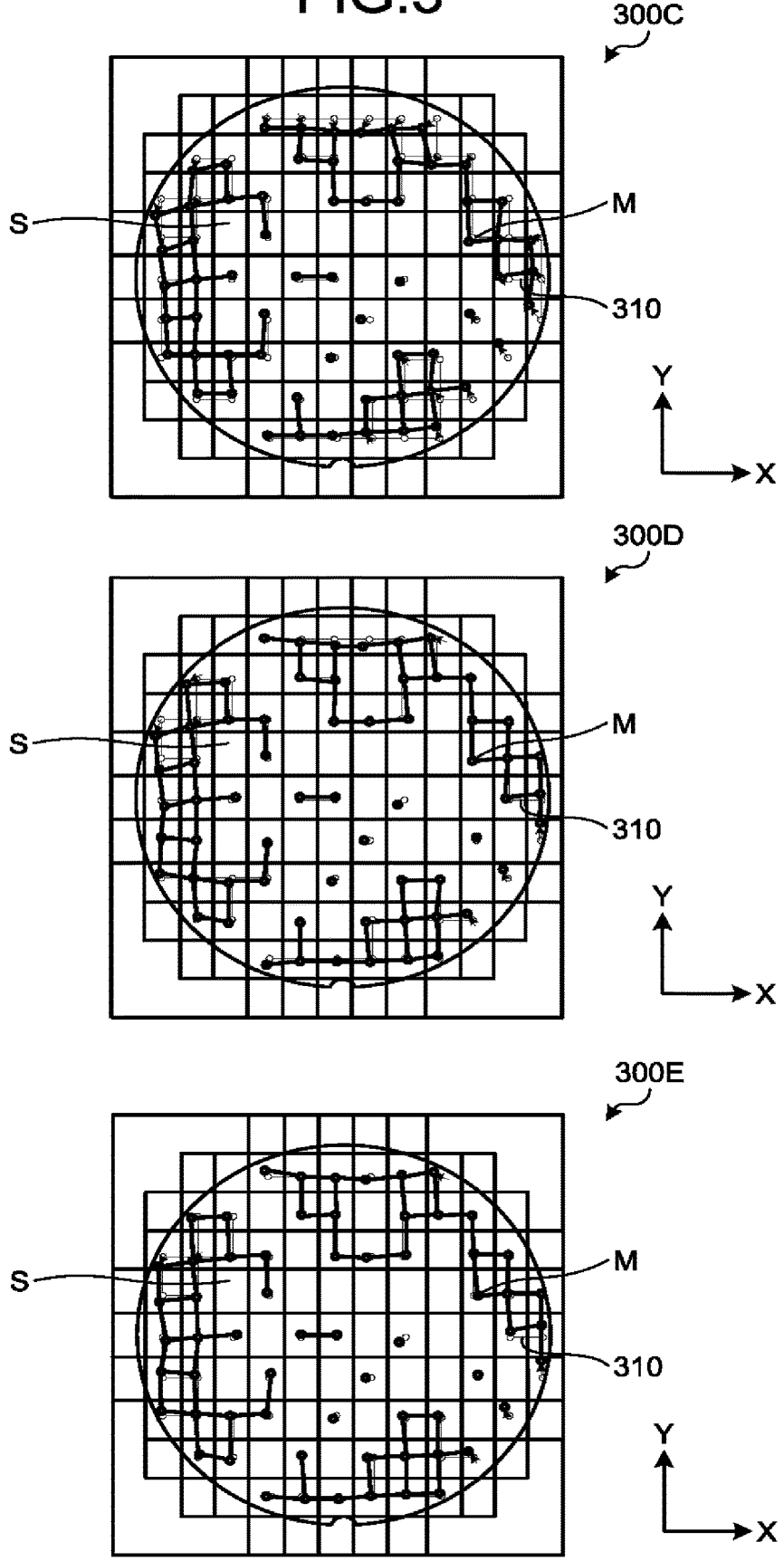
FIG. 3 is a diagram illustrating an example of grid measurement information on second substrates.

FIG. 2 is a diagram illustrating an example of grid measurement information on first substrates. FIG. 3 is a diagram illustrating an example of grid measurement information on second substrates. FIG. 2 illustrates pieces of grid data 300A and 300B on two different first substrates 110 stored in the first storage container 60. FIG. 3 illustrates pieces of grid data 300C to 300E on three different second substrates 120 stored in the second storage container 70. Hereinafter, when the respective pieces of grid data 300A to 300E do not need distinction, the grid data 300A to 300E will be referred to as "grid data 300".

In FIGS. 2 and 3, the lines separating shot regions S provided on a substrate are drawn for ease of explanation. Each shot region S is a region treated as a light-exposure range in a light-exposure process. The two pairs of side lines of each shot region S are in parallel with an X-axis and a Y-axis orthogonal to each other provided in the substrate plane. As illustrated in FIGS. 2 and 3, the grid data 300 on a substrate is formed by detecting marks M provided near the centers of shot regions S, and mutually connecting by straight lines the marks M of shot regions S adjacent to each other in an X-direction or Y-direction.

Further, FIGS. 2 and 3 also illustrate ideal grid data 310. The ideal grid data 310 is formed by mutually connecting by straight lines the center positions of shot regions S adjacent to each other in the X-direction or Y-direction. As illustrated in FIGS. 2 and 3, in general, the actual grid data 300 deviates from the ideal grid data 310.

The grid matching rate calculation unit 43 is configured to calculate a matching rate between pieces of grid data (which may be referred to as "grid matching rate", hereinafter), for every combination of a first substrate 110 in the first storage container 60 with a second substrate 120 in the second storage container 70. Further, when the grid matching rate falls within a lamination threshold range, the grid matching rate calculation unit 43 registers this combination of the first substrate 110 with the second substrate 120 into pairing information in the substrate information storage unit 44. The lamination threshold range has been determined, in accordance with the correction accuracy about the positional deviation (Shift), magnification deviation (Magnification), and rotational deviation (Rotation) between the first substrate 110 and the second substrate 120 in the substrate holding planes of the first substrate holder 20 and the second substrate holder 30, and in accordance with the desired product specification. The lamination threshold range may be set to be between 50% and 100%, for example.

The grid matching rate calculation unit 43 may be configured to treat the grid data on each of first and second substrates 110 and 120 as image data, and to obtain a matching rate of grid shapes by image processing. Further, when the grid data on each of first and second substrates 110 and 120 is expressed by an absolute position coordinate system using a predetermined point on the substrate as a reference, the grid matching rate calculation unit 43 may be configured to obtain a matching rate of grid shapes from deviations at respective positions by using an predetermined algorithm.

As illustrated in FIG. 1, it is assumed that a first substrate 110 and a second substrate 120 are to be laminated and bonded in a state where the face of the first substrate 110 with the memory cell layer 112 arranged thereon and the face of the second substrate 120 with the peripheral circuit layer 122 arranged thereon are opposed to each other. In this case, the first substrate 110 and the second substrate 120 are set to face each other, and calculation of a grid matching rate is performed between corresponding positions of pieces of grid data. Specifically, calculation of a grid matching rate is performed by using the pieces of grid data 300A and 300B on first substrates 110 illustrated in FIG. 2, and pieces of inverted grid data obtained by inverting in the X-direction the pieces of grid data 300C to 300E on second substrates 120 illustrated in FIG. 3.

Alternatively, it is assumed that a first substrate 110 and a second substrate 120 are to be laminated and bonded in a state where the face of the first substrate 110 with the memory cell layer 112 arranged thereon and the face of the second substrate 120, which is opposite to the face with the peripheral circuit layer 122 arranged thereon, are opposed to each other. In this case, calculation of a grid matching rate is performed by using the pieces of grid data 300A and 300B on first substrates 110 illustrated in FIG. 2, and the pieces of grid data 300C to 300E on second substrates 120 illustrated in FIG. 3.

FIG. 4 is a diagram illustrating an example of calculation results of a grid matching rate. FIG. 4 illustrates a case where calculation of a grid matching rate is performed to each of the pieces of grid data 300A and 300B on first substrates 110 illustrated in FIG. 2 with respect to each of the pieces of grid data 300C to 300E on second substrates 120 illustrated in FIG. 3. Further, here, the lamination threshold range is assumed to be 80% or more and 100% or less. The grid matching rates of the grid data 300A of a first substrate 110 with respect to the pieces of grid data 300C, 300D, and 300E of second substrates are 90%, 80%, and 70%, respectively. As the lamination threshold range described above is 80% or more, the combination of the grid data 300A with the grid data 300C and the combination of the grid data 300A with the grid data 300D, in each of which the grid matching rate is 80% or more, are registered into the pairing information. Similarly, the grid matching rates of the grid data 300B with respect to the pieces of grid data 300C to 300E are 80% or more in all the combinations. Thus, these combinations are registered into the pairing information.

The substrate information storage unit 44 stores substrate information that contains substrate storage state information and pairing information. FIGS. 5A and 5B are diagrams illustrating examples of the substrate information. FIG. 5A is a diagram illustrating an example of the substrate storage state information, and FIG. 5B is a diagram illustrating an example of the pairing information. As illustrated in FIG. 5A, the substrate storage state information is information that manages the first substrates 110 stored in the respective slots 61 of the first storage container 60 and the second substrates 120 stored in the respective slots 71 of the second storage container 70. In this example, this information correlates slot numbers that identify the slots of each storage container with pieces of substrate identification information that identify the substrates. For example, the substrate storage state information on the first storage container shows that the slot number "1" stores a first substrate 110 identified by CELLW1, the slot number "2" stores a first substrate 110 identified by CELLW2, and a slot number "i" stores a first substrate 110 identified by CELLWi (i is a natural number of "n" or less). The substrate storage state information on the second storage container is also substantially the same as the above.

The pairing information correlates each first substrate 110 in the first storage container 60 with a second substrate 120 that satisfies the lamination threshold range, for example. Here, one first substrate 110 may be correlated with a plurality of second substrates 120. In the example illustrated in FIG. 5B, pieces of first substrate identification information are correlated with pieces of second substrate identification information that satisfy the lamination threshold range. The arrangement order of the pieces of second substrate identification information correlated with each piece of first substrate identification information is not limited to a specific one. However, these information pieces may be arranged in descending order of grid matching rate.

Here, in the example illustrated in FIG. 5B, the pairing information correlates each piece of first substrate identification information with pieces of second substrate identification information that have grid matching rates falling within the lamination threshold range. However, the embodiment is not limited to this example. For example, the pairing information may correlate each piece of second substrate identification information with pieces of first substrate identification information that have grid matching rates falling within the lamination threshold range.

The substrate transfer instruction unit 45 is configured to extract a combination of a first substrate 110 and a second substrate 120 to be laminated and bonded, on the basis of the substrate information stored in the substrate information storage unit 44. Further, the substrate transfer instruction unit 45 is configured to give instructions to a transfer part (not illustrated), the first substrate holder 20, and the second substrate holder 30, to transfer the first substrate 110 and the second substrate 120 of the extracted combination from the corresponding slots 61 and 71 of the first storage container 60 and the second storage container 70, and to hold the first substrate 110 and the second substrate 120 by the first substrate holder 20 and the second substrate holder 30, respectively.

For example, when performing lamination bonding for the first substrate 110 stored in the slot number "1" of the first storage container 60, the substrate transfer instruction unit 45 acquires the piece of first substrate identification information "CELLW1" on the first substrate 110 stored in the slot number "1", from the substrate storage state information. Then, the substrate transfer instruction unit 45 acquires the pieces of second substrate identification information "PERIW2", "PERIW5", and "PERIW15" correlated with the piece of first substrate identification information "CELLW1", from the pairing information. The substrate transfer instruction unit 45 selects one of the pieces of second substrate identification information. For example, here, it is assumed that "PERIW2" is selected. The substrate transfer instruction unit 45 acquires, from the substrate storage state information, the slot number "2" that stores the second substrate 120 identified by the piece of the second substrate identification information "PERIW2". Then, the substrate transfer instruction unit 45 gives instructions to transfer the first substrate 110 and the second substrate 120 respectively from the slot 61 of the slot number "1" of the first storage container 60 and the slot 71 of the slot number "2" of the second storage container 70, and further gives instructions to cause the first stage 21 and the second stage 31 to hold the first substrate 110 and the second substrate 120 thus transferred, respectively.

When extracting a piece of second substrate identification information correlated with a piece of first substrate identification information, the substrate transfer instruction unit 45 may extract the piece of second substrate identification information having the highest grid matching rate with the piece of first substrate identification information, or may extract a piece of second substrate identification information at random. Further, when, in the pairing information, there is a piece of second substrate identification information correlated with another piece of first substrate identification information and already selected, the substrate transfer instruction unit 45 operates as follows. Specifically, since such a selected piece of second substrate identification information indicates a substrate already used for lamination bonding, the substrate transfer instruction unit 45 deletes or invalidates this piece of second substrate identification information.

The correction instruction unit 46 is configured to give a correction instruction to at least one of the first drive mechanism 22 and the second drive mechanism 32, when the pieces of grid data 300 on a first substrate 110 and a second substrate 120 selected as lamination bonding objects need a correction at the time of lamination bonding. The correction instruction is an instruction for correcting the positional deviation, magnification deviation, or rotational deviation. The correction instruction about the positional deviation, magnification deviation, or rotational deviation is generated on the basis of the pieces of grid data. In accordance with the instruction, at least one of the first stage 21 and the second stage 31 is moved in position, and/or is rotated by a predetermined angle in the substrate holding plane, by using at least one of the first drive mechanism 22 and the second drive mechanism 32. However, when no correction is necessary, such as when the grid matching rate between a first substrate 110 and a second substrate 120 is approximate to 100%, the correction instruction unit 46 does not necessarily need to give a correction instruction.

The lamination bonding control unit 47 is configured to give an instruction to at least one of the first drive mechanism 22 and the second drive mechanism 32, to bring a second substrate 120 held on the second stage 31 into contact with a first substrate 110 held on the first stage 21, through an adhesive layer, for example. Further, the lamination bonding control unit 47 is configured to give an instruction to at least one of the first drive mechanism 22 and the second drive mechanism 32, to stop the operation of the chucking mechanism of the first stage 21 or the second stage 31 and to separate the first stage 21 and the second stage 31 from each other, after a lapse of a predetermined time.

Figure 6:
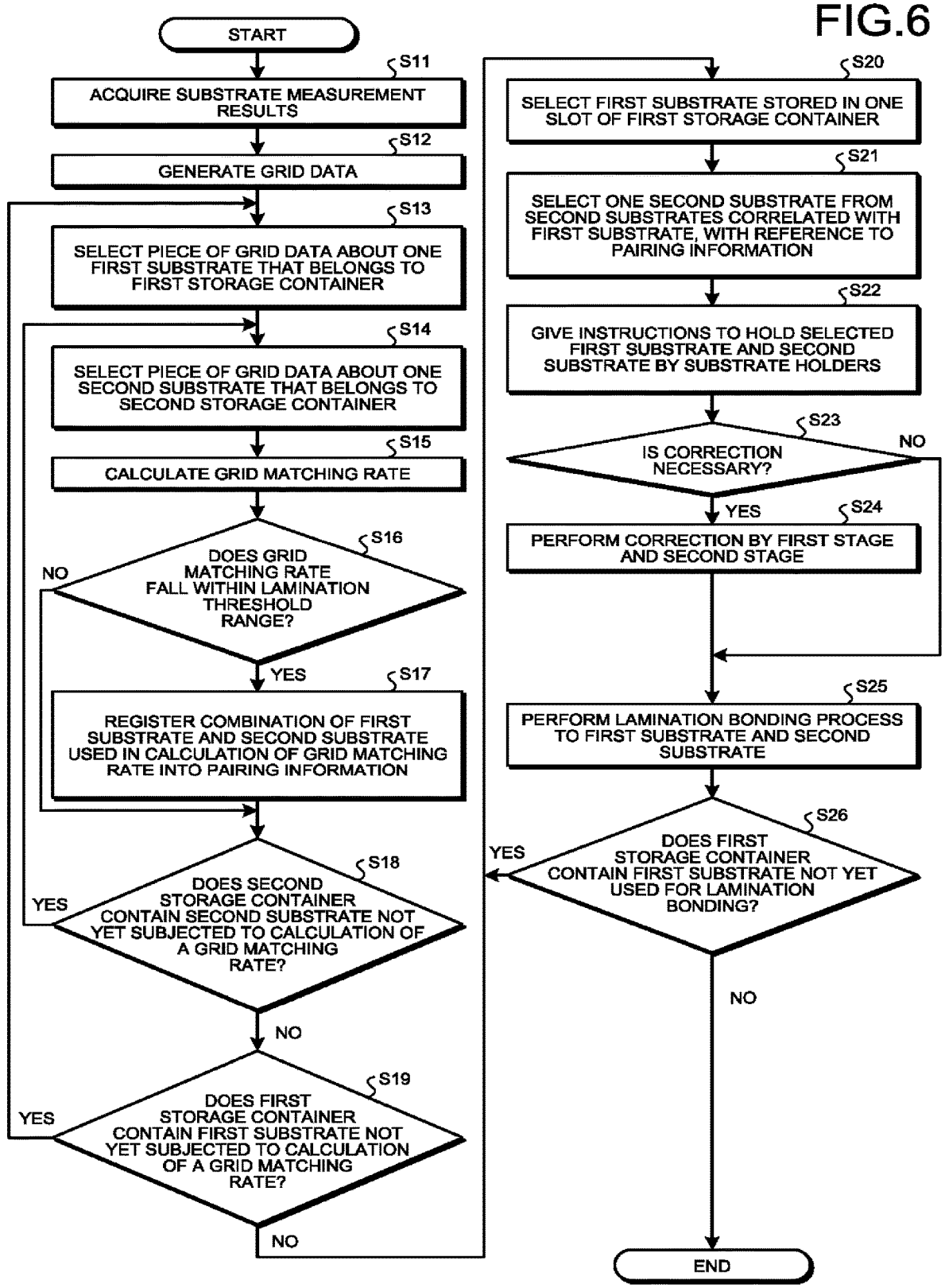
FIG. 6 is a flowchart illustrating an example of the sequence of a semiconductor device manufacturing method according to the embodiment.

Next, an explanation will be given of a semiconductor device manufacturing method that includes a lamination bonding method using the bonding apparatus 10. FIG. 6 is a flowchart illustrating an example of the sequence of a semiconductor device manufacturing method according to the embodiment. First, the positions of predetermined patterns on a substrate is measured, for each of the first substrates 110 in the first storage container 60 and for each of the second substrates 120 in the second storage container 70. The pattern position measurement is performed by using an overlay inspection apparatus, absolute position measuring apparatus, or substrate shape measuring apparatus. Thereafter, the first storage container 60 storing the first substrates 110 and the second storage container 70 storing the second substrates 120 are transferred to a position near the bonding apparatus 10.

Then, the substrate measurement result acquisition unit 41 of the controller 40 acquires substrate measurement results, each of which is a measurement result about the positions of predetermined patterns on each of the first substrates 110 and the second substrates 120 (step S11). Thereafter, the grid data generation unit 42 generates pieces of grid data from all the substrate measurement results thus acquired (step S12). Each piece of grid data is data in which the positions of predetermined patterns are connected to the positions of predetermined patterns by lines in each of the substrate measurement results.

Then, the grid matching rate calculation unit 43 selects a piece of grid data on one first substrate 110 that belongs to the first storage container 60 (step S13), and selects a piece of grid data on a second substrate 120 that belongs to the second storage container 70 (step S14). Then, the grid matching rate calculation unit 43 calculates a grid matching rate between these two pieces of grid data thus selected, by using a known comparing method (step S15).

Then, the grid matching rate calculation unit 43 determines whether the grid matching rate falls within a lamination threshold range (step S16). When the grid matching rate falls within the lamination threshold range (Yes at step S16), the grid matching rate calculation unit 43 registers this combination of the first substrate 110 and the second substrate 120, which has the grid matching rate thus calculated, into the pairing information (step S17).

Thereafter, or when the grid matching rate does not fall within the lamination threshold range in step S16 (No at step S16), the grid matching rate calculation unit 43 determines whether the second storage container 70 contains another second substrate 120 not yet subjected to calculation of a grid matching rate, among the second substrates 120 that belong thereto (step S18). This determination is performed by using the substrate storage state information of FIG. 5A, for example.

When the second storage container 70 contains another second substrate 120 not yet subjected to calculation of a grid matching rate (Yes at step S18), the sequence returns to step S14. In other words, the processes of step S14 to S17 are performed to all the second substrates 120 in the second storage container 70.

On the other hand, when the second storage container 70 contains no other second substrate 120 not yet subjected to calculation of a grid matching rate (No at step S18), it means that all the combinations of the first substrate 110 selected in step S12 with the respective second substrates 120 in the second storage container 70 have been subjected to calculation of a grid matching rate. Thus, the grid matching rate calculation unit 43 determines whether the first storage container 60 contains another first substrate 110 not yet subjected to calculation of a grid matching rate (step S19). This determination is also performed by using the substrate storage state information of FIG. 5A, for example.

When the first storage container 60 contains another first substrate 110 not yet subjected to calculation of a grid matching rate (Yes at step S19), the sequence returns to step S13. Thus, the processes as in step S13 to S18 are performed for this other first substrates 110. Then, until the first storage container 60 comes to contain no other first substrate 110 not yet subjected to calculation of a grid matching rate, the processes of step S13 to S19 are performed. Consequently, the pairing information concerning the first substrates 110 and the second substrates 120 is generated.

When the first storage container 60 contains no other first substrate 110 not yet subjected to calculation of a grid matching rate (No at step S19), the substrate transfer instruction unit 45 selects a first substrate 110 stored in one slot of the first storage container 60 (step S20).

Then, the substrate transfer instruction unit 45 selects, with reference to the pairing information, one second substrate 120 from the second substrates 120 correlated with the first substrate 110 thus selected (step S21). The selection of a second substrate 120 can be performed by an arbitrary method.

Thereafter, the substrate transfer instruction unit 45 gives, to the transfer part, the first drive mechanism 22, and the second drive mechanism 32, instructions to take the first substrate 110 selected in step S20 out of the first storage container 60 and to hold this first substrate 110 onto the first stage 21, and instructions to take the second substrate 120 selected in step S21 out of the second storage container 70 and to hold this second substrate 120 onto the second stage 31 (step S22). Consequently, the first substrate 110 is held by the first stage 21, and the second substrate 120 is held by the second stage 31.

Then, the correction instruction unit 46 determines whether any correction is necessary on the basis of the pieces of grid data on the selected first substrate 110 and the selected second substrate 120 (step S23). When a correction is necessary (Yes at step S23), the correction instruction unit 46 gives, to the first drive mechanism 22 or the second drive mechanism 32, a correction instruction in a direction for the pieces of grid data on the first substrate 110 and the second substrate 120 to agree with each other. As a result, the first drive mechanism 22 or the second drive mechanism 32 performs the correction by moving the first stage 21 or the second stage 31 in a direction to correct the positional deviation, magnification deviation, or rotational deviation between the first substrate 110 and the second substrate 120 (step S24).

Thereafter, or when no correction is necessary in step S23 (No at step S23), after an adhesive layer is formed on the first substrate 110, for example, the lamination bonding control unit 47 gives instructions to the first drive mechanism 22 or the second drive mechanism 32, to laminate and bond the first substrate 110 on the first stage 21 and the second substrate 120 on the second stage 31 to each other by the adhesive layer. Accordingly, a lamination bonding process is performed (step S25). In the lamination bonding process, the first substrate 110 and the second substrate 120 are set in contact with each other through the adhesive layer, and are mutually bonded. Then, after the adhesive layer is solidified, the chucking mechanism of the first stage 21 or the second stage 31 is unlocked, and the first stage 21 and the second stage 31 are separated from each other. Then, a semiconductor device thus formed by lamination bonding of the two substrates is transferred to a predetermined position.

Thereafter, the substrate transfer instruction unit 45 determines whether the first storage container 60 contains a first substrate 110 not yet used for lamination bonding (step S26). When the first storage container 60 contains a first substrate 110 not yet used for lamination bonding (Yes at step S26), the sequence returns step S20. Then, until the first storage container 60 comes to contain no first substrate 110 not yet used for lamination bonding, the processes of steps S20 to S25 are repeatedly performed.

On the other hand, when the first storage container 60 contains no first substrate 110 not yet used for lamination bonding (No in step S26), the sequence ends.

Figure 7A:
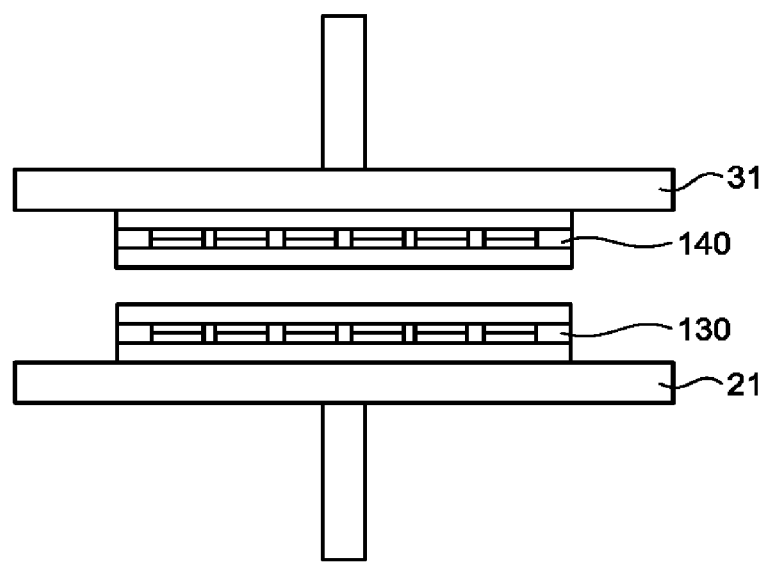
FIGS. 7A and 7B are diagrams schematically illustrating other examples of a semiconductor device manufacturing method according to the embodiment.
Figure 7B:
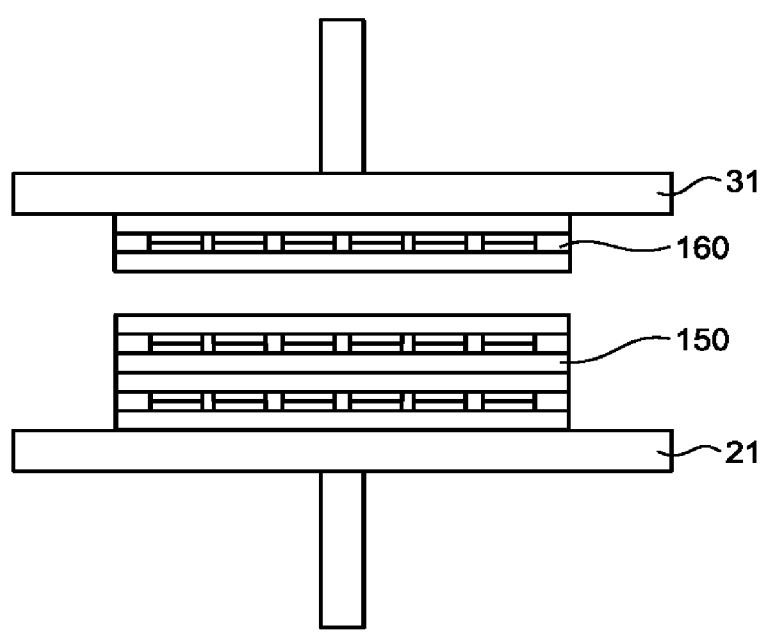

In the example described above, a first substrate 110 with the memory cell layer 112 arranged thereon and a second substrate 120 with the peripheral circuit layer 122 arranged thereon are mutually laminated and bonded. However, the embodiment is not limited to this example. FIGS. 7A and 7B are diagrams schematically illustrating other examples of a semiconductor device manufacturing method according to the embodiment. As illustrated in FIG. 7A, the embodiment described above may also be used for mutually laminating and bonding two substrates each prepared by lamination bonding (each of which will be referred to as "laminated substrate", hereinafter) 130 and 140. Further, as illustrated in FIG. 7B, the embodiment described above may also be used for laminating and bonding a laminated substrate prepared by lamination bonding of two laminated substrates (a laminated substrate prepared by lamination bonding of four substrates) 150, to a laminated substrate 160 prepared by lamination bonding of two substrates. Other than these examples, the embodiment described above may be used for laminating and bonding a laminated substrate prepared by lamination bonding of an arbitrary number of substrates, to a substrate or a laminated substrate prepared by lamination bonding of an arbitrary number of substrates. In these cases, calculation of a grid matching rate is performed by using a grid measurement result about the face with a device layer arranged thereon, such as a memory cell or drive circuit layer, of the substrate on the side to be bonded of each of the laminated substrates 130, 140, 150, and 160.

Further, in the example described above, combinations are formed from first substrates 110 in the first storage container 60 and second substrates 120 in the second storage container 70. However, the embodiment is not limited to this example. The embodiment described above may be applied as long as the lamination bonding objects are a plurality of first substrates 110 and a plurality of second substrates 120.

For example, the lamination bonding objects may be first substrates 110 in a plurality of first storage containers 60 and second substrates 120 in a plurality of second storage containers 70.

Figure 8:
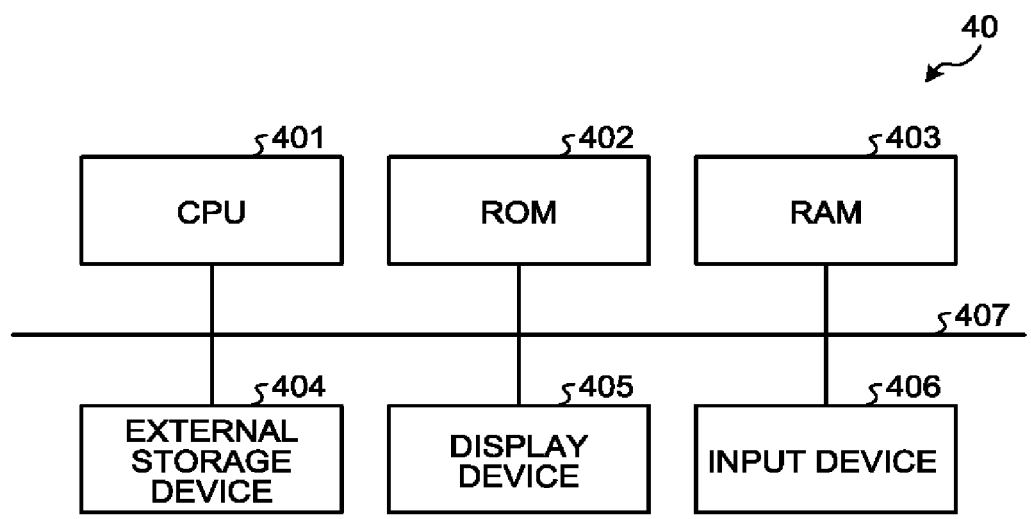
FIG. 8 is a diagram illustrating a hardware configuration of a controller.

Next, explanation will be give of a hardware configuration of the controller 40 of the bonding apparatus 10. FIG. 8 is a diagram illustrating a hardware configuration of the controller. The controller 40 includes a Central Processing Unit (CPU) 401, a Read Only Memory (ROM) 402, a Random Access Memory (RAM) 403, an external storage device 404, a display device 405, and an input device 406. In the controller 40, the CPU 401, the ROM 402, the RAM 403, the external storage device 404, the display device 405, and the input device 406 are connected to each other via a bus line 407.

The CPU 401 uses a lamination bonding program, which is a computer program, to select a combination of a first substrate and a second substrate, which has a grid matching rate falling within a lamination threshold range, from a plurality of first substrates and a plurality of second substrates. The lamination bonding program is formed of a computer program product that includes a recording medium readable by a computer and nontransitory (nontransitory computer readable recording medium). The recording medium contains a plurality of commands executable by a computer to generate pieces of grid data from substrate measurement results, to calculate a grid matching rate between each piece of grid data on a first substrate 110 and each piece of grid data on a second substrate 120, to register combinations, each of which has a grid matching rate falling within a lamination threshold range, into pairing information, and to select a second substrate 120 to be laminated and boned to a first substrate 110 treated as a lamination bonding object, on the basis of the pairing information. In the lamination bonding program, the plurality of commands cause the computer to execute the generation of grid data, the calculation of a grid matching rate, the registration of pairing information, the selection of a second substrate 120 to be laminated and bonded to a first substrate 110 on the basis of the pairing information, and so forth.

The external storage device 404 is formed of a Hard Disk Drive (HDD), Solid State Drive (SSD), Compact Disc (CD) drive device, or the like. The display device 405 is formed of a liquid crystal display device or the like. The display device 405 displays data, information, and so forth on the basis of an instruction from the CPU 401. The input device 406 is formed of a mouse, a keyboard, and so forth.

The lamination bonding program is stored in the ROM 402, and can be loaded into the RAM 403 through the bus line 407.

The CPU 401 executes the lamination bonding program loaded in the RAM 403. Specifically, in the controller 40 of the bonding apparatus 10, in response to an instruction input from the input device 406 by a user, the CPU 401 reads the lamination bonding program out of the ROM 402, and loads the program into a program storage region formed in the RAM 403, to perform various processes. The CPU 401 temporarily stores various data, generated by these various processes, into a data storage region formed in the RAM 403.

The lamination bonding program to be executed by the controller 40 is formed in a module configuration that contains the substrate measurement result acquisition unit 41, the grid data generation unit 42, the grid matching rate calculation unit 43, the substrate transfer instruction unit 45, the correction instruction unit 46, the lamination bonding control unit 47, and so forth. These units are loaded into the main storage device, and are generated in the main storage device.

The lamination bonding program to be executed by the controller 40 according to this embodiment has been prepared to perform the method illustrated in FIG. 6. This program is provided in a state recorded in a computer readable recording medium, such as a CD-ROM, flexible disk (FD), CD-R, or Digital Versatile Disk (DVD), by a file in an installable format or executable format.

Alternatively, the lamination bonding program to be executed by the controller 40 according to this embodiment may be provided such that the program is stored in a computer connected to a network, such as the internet, and is downloaded via the network. Alternatively, the lamination bonding program to be executed by the controller 40 of the bonding apparatus 10 according to this embodiment may be provided such that the program is provided or distributed via a network, such as the internet.

Alternatively, the lamination bonding program to be executed by the bonding apparatus 10 according to this embodiment may be provided in a state incorporated in an ROM or the like in advance.

In the embodiment, a grid matching rate is calculated for every combination between a plurality of first substrates 110 and a plurality of second substrates 120, and each combination having a grid matching rate falling within a lamination threshold range is registered as a pair into the pairing information. When a lamination bonding process is to be performed by using a first substrate 110 in the first storage container 60, a second substrate 120 is selected from the second substrates 120 correlated with this first substrate 110, on the basis of the pairing information. Then, the lamination bonding process is performed by using the first substrate 110 with the second substrate 120 thus selected. Consequently, it is possible to improve alignment accuracy between each shot region of the first substrate 110 and each shot region of the second substrate 120.

In general, the first substrates 110 in the first storage container 60 are selected in order from the uppermost slot 61, and the second substrates 120 in the second storage container 70 are selected in order from the uppermost slot 71, to perform a lamination bonding process for respective pairs. In this case, the grid matching rate of each pair is low, and thus it is difficult to reduce the probability of manufacturing a laminated substrate that is unusable as a product. On the other hand, according to the embodiment, a combination of a first substrate 110 and a second substrate 120 having a high grid matching rate is acquired before the lamination bonding process, and thus it is possible to reduce the probability of manufacturing a laminated substrate that is unusable as a product.

In the example described above, an explanation has been given of a substrate bonding apparatus for laminating and bonding substrates to each other. However, a substrate pairing apparatus for pairing substrates with each other may also have substantially the same configuration.

While certain embodiments have beer described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate bonding apparatus, comprising:
    a first semiconductor wafer holder configured to hold a semiconductor wafer selected from a first semiconductor wafer group;
    a second semiconductor wafer holder arranged opposite to the first semiconductor wafer holder, and configured to hold a semiconductor wafer selected from a second semiconductor wafer group; and
    a controller configured to control lamination bonding of the semiconductor wafers held by the first semiconductor wafer holder and the second semiconductor wafer holder,
    wherein the controller is configured to:
        calculate a matching rate of grid shapes between each semiconductor wafer of the first semiconductor wafer group and each semiconductor wafer of the second semiconductor wafer group,
        generate pairing information, into which combinations of the semiconductor wafers used in the calculation of matching rates are registered when the matching rates fall within a predetermined range,
        select a first semiconductor wafer to be held by the first semiconductor wafer holder from the first semiconductor wafer group, and
        select a second semiconductor wafer from the semiconductor wafers of the second semiconductor wafer group that are paired with the first semiconductor wafer, with reference to the pairing information,
    wherein, in the calculation of the matching rate, the controller is further configured to calculate a matching rate between two pieces of grid data by image processing using the grid data as an image.

2. The substrate bonding apparatus according to claim 1, wherein, before the calculation of the matching rate, the controller is further configured to:
    acquire a substrate measurement result by measuring positions of predetermined patterns on each semiconductor wafer, and
    generate the grid data, which is data formed by connecting the predetermined patterns on each semiconductor wafer by straight lines, based on the substrate measurement result, and
    in the calculation of the matching rate, the generated grid data is used.

3. The substrate bonding apparatus according to claim 2, wherein, in the calculation of the matching rate, when the grid data is expressed by an absolute position coordinate system using a predetermined position on each semiconductor wafer as a reference, the controller is further configured to calculate a matching rate between the two pieces of grid data by using a predetermined algorithm, based on a positional deviation of the predetermined patterns between two semiconductor wafers corresponding to the two pieces of grid data.

4. The substrate bonding apparatus according to claim 1, wherein the pairing information generated by the controller correlates one semiconductor wafer of the first semiconductor wafer group with a plurality of semiconductor wafers of the second semiconductor wafer group.

5. A substrate pairing apparatus, comprising:
    a first semiconductor wafer holder configured to hold a semiconductor wafer selected from a first semiconductor wafer group;

a second semiconductor wafer holder arranged opposite to the first semiconductor wafer holder, and configured to hold a semiconductor wafer selected from a second semiconductor wafer group; and a controller configured to control pairing of the semiconductor wafers held by the first semiconductor wafer holder and the second semiconductor wafer holder, wherein the controller is configured to:
calculate a matching rate of grid shapes between each semiconductor wafer of the first semiconductor wafer group and each semiconductor wafer of the second semiconductor wafer group,
generate pairing information, into which combinations of the semiconductor wafers used in the calculation of matching rates are registered when the matching rates fall within a predetermined range,
select a first semiconductor wafer to be held by the first semiconductor water holder from the first semiconductor wafer group, and
select a second semiconductor wafer from the semiconductor wafers of the second semiconductor wafer group that are paired with the first semiconductor wafer, with reference to the pairing information,
wherein, in the calculation of the matching rate, the controller is further configured to calculate a matching rate between two pieces of grid data by image processing using the grid data as an image.

6. The substrate pairing apparatus according to claim 5, wherein, before the calculation of the matching rate, the controller is further configured to:
acquire a substrate measurement result by measuring positions of predetermined patterns on each semiconductor wafer, and
generate the grid data, which is data formed by connecting the predetermined patterns on each semiconductor water by straight lines, based on the substrate measurement result, and
in the calculation of the matching rate, the generated grid data is used.

7. The substrate pairing apparatus according to claim 6, wherein, in the calculation of the matching rate, when the grid data is expressed by an absolute position coordinate system using a predetermined position on each semiconductor wafer as a reference, the controller s further configured to calculate a matching rate between the two pieces of grid data by using a predetermined algorithm, based on a positional deviation of the predetermined patterns between two semiconductor wafers corresponding to the two pieces of grid data.

8. The substrate pairing apparatus according to claim 5, wherein the pairing information generated by the controller correlates one semiconductor wafer of the first semiconductor wafer group with a plurality of semiconductor wafers of the second semiconductor wafer group.

9. A semiconductor device manufacturing method, comprising:
calculating a matching rate of grid shapes between each semiconductor water of a first semiconductor water group and each semiconductor wafer of a second semiconductor wafer group;
generating pairing information, into which combinations of semiconductor wafers used in the calculation of matching rates are registered when the matching rates fall within a predetermined range;
selecting a first semiconductor wafer from the first semiconductor wafer group;

selecting a second semiconductor wafer from semiconductor wafers of the second semiconductor wafer group that are paired with the first semiconductor wafer, with reference to the pairing information;
holding the first semiconductor wafer and the second semiconductor wafer by a first substrate holder and a second substrate holder arranged opposite to the first semiconductor wafer holder, respectively, in a substrate bonding apparatus; and
laminating and bonding the first semiconductor wafer and the second semiconductor wafer to each other through an adhesive layer,
wherein, before the calculating of the matching rate the method further comprises acquiring a substrate measurement result by measuring positions of predetermined patterns on each semiconductor wafer, and generating grid data, which is data formed by connecting the predetermined patterns on each semiconductor wafer by straight lines, based on the substrate measurement result;
in the calculating the matching rate, the generated rid data is used; and
in the calculating of the matching rate, a matching rate between two pieces of grid data is calculated by image processing using the generated grid data as an image.

10. The semiconductor device manufacturing method according to claim 9, wherein, in the calculating of the matching rate, when the grid data is expressed by an absolute position coordinate system using a predetermined position on each semiconductor wafer as a reference, a matching rate between the two pieces of grid data is calculated by using a predetermined algorithm, based on a positional deviation of the predetermined patterns between two semiconductor wafers corresponding to the two pieces of grid data.

11. The semiconductor device manufacturing method according to claim 9, wherein the pairing information correlates one semiconductor wafer of the first semiconductor wafer group with a plurality of semiconductor wafers of the second semiconductor wafer group.

12. The semiconductor device manufacturing method according to claim 9, wherein
each semiconductor wafer belonging to the first semiconductor wafer group is a semiconductor wafer with a memory cell layer arranged on a first face, and
each semiconductor wafer belonging to the second semiconductor wafer group is a semiconductor wafer with a peripheral circuit layer, which includes circuits for driving memory cells included in the memory cell layer, arranged on a second face.

13. The semiconductor device manufacturing method according to claim 9, wherein, before the laminating and bonding of the first semiconductor wafer and the second semiconductor wafer, the method further comprises:
determining whether a correction is necessary; and
performing the correction that is determined necessary, by moving the first substrate holder or the second substrate holder in a direction to correct a positional deviation, magnification deviation, or rotational deviation between the first substrate holder and the second substrate holder.

14. A semiconductor device manufacturing method, comprising:
calculating a matching rate of grid shapes between each semiconductor wafer of a first semiconductor wafer group and each semiconductor wafer of a second semiconductor wafer group;

generating pairing information, into which combinations of semiconductor wafers used in the calculation of matching rates are registered when the matching rates fall within a predetermined range;

selecting a first semiconductor wafer from the first semiconductor wafer group;

selecting a second semiconductor wafer from semiconductor wafers of the second semiconductor wafer group that are paired with the first semiconductor wafer, with reference to the pairing information;

holding the first semiconductor wafer and the second semiconductor wafer by a first substrate holder and a second substrate holder arranged opposite to the first semiconductor wafer holder, respectively, in a substrate bonding apparatus; and laminating and bonding the first semiconductor wafer and the second semiconductor wafer to each other through an adhesive layer, wherein before the calculating of the matching rate, the method further comprises acquiring a substrate measurement result by measuring positions of predetermined patterns on each semiconductor wafer, and generating grid data, which is data formed by connecting the predetermined patterns on each semiconductor wafer by straight lines, based on the substrate measurement result;

in the calculating of the matching rate, the generated grid data is used; and wherein the grid data is generated by detecting a mark of a first shot region, among marks at centers of respective shot regions provided on each semiconductor wafer, further detecting a mark of a second shot region adjacent to the first shot region in one of a first direction and a second direction orthogonal to each other, and connecting the marks thus detected by a straight line.

15. The semiconductor device manufacturing method according to claim 9, wherein the first semiconductor wafer or the second semiconductor wafer is in a state prepared by lamination bonding of a plurality of semiconductor wafers in advance.

16. The semiconductor device manufacturing method according to claim 9, wherein, in the selecting of the second semiconductor wafer from semiconductor wafers of the second semiconductor wafer group that are paired with the first semiconductor wafer, the second semiconductor wafer having a highest matching rate, or selecting the second semiconductor wafer at random, in the pairing information is selected.

\* \* \* \* \*